United States Patent [19]

Nishiguchi

[11] Patent Number: 4,965,247
[45] Date of Patent: Oct. 23, 1990

[54] SUPERCONDUCTING COIL AND A METHOD FOR PRODUCING THE SAME

[75] Inventor: Masanori Nishiguchi, Kanagawa, Japan

[73] Assignee: Sumitomo Electric Industries, Ltd., Osaka, Japan

[21] Appl. No.: 215,288

[22] Filed: Jul. 5, 1988

[30] Foreign Application Priority Data

Jul. 6, 1987 [JP] Japan .................................. 62-168358

[51] Int. Cl.$^5$ ................................................. B23B 3/00
[52] U.S. Cl. ......................................... 505/1; 505/701; 505/702; 505/703; 505/704; 428/688; 428/34.1; 428/901; 428/930; 427/62; 156/89
[58] Field of Search ............................ 505/1, 700-704; 428/688, 34.1, 930, 901; 427/62; 156/89

[56] References Cited

U.S. PATENT DOCUMENTS 3,470,508 9/1969 Donadieu et al. .................. 335/216
4,826,808 5/1989 Yurek et al. ............................. 505/1

OTHER PUBLICATIONS

Technische Mitteilungen, vol. 80, No. 8, Sep./Oct. 1987, Essen, Germany G. Bogner "Technische Anwendungen der Supraleitung-Anforderungen an Die Neuen Hochtemperatur-Supraleiter" pp. 493-501.
Condensed Matter, Europhysics Journal, vol. 64, No. 2, Sep. 1986, (Zurich, Switzerland), J. G. Bednosz and K. A. Muller "Possible High T Superconductivity in the Ba—La—Cu—O System", pp. 189-193.
Japanese Journal of Applied Physics, vol. 27, No. 5, May 1988, pp. L799-801, Tanaka et al., YBCO Superconducting Coils.

Primary Examiner—Patrick Ryan
Attorney, Agent, or Firm—Cushman, Darby & Cushman

[57] ABSTRACT

A superconducting coil comprising a support (1,10) and at least one ring-shaped and/or spiral turn (2) of superconductor which is composed of superconducting compound oxide and is supported on a surface of said support.

18 Claims, 2 Drawing Sheets

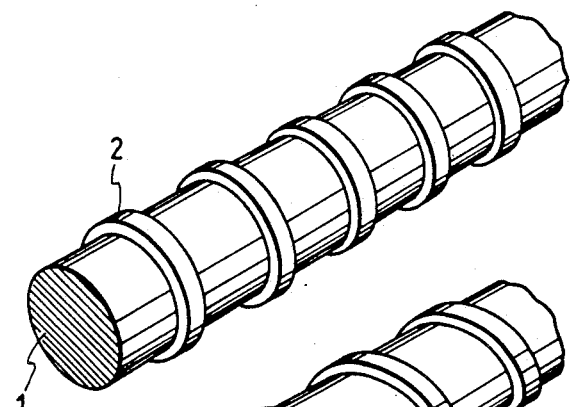
FIG. 1 (a)
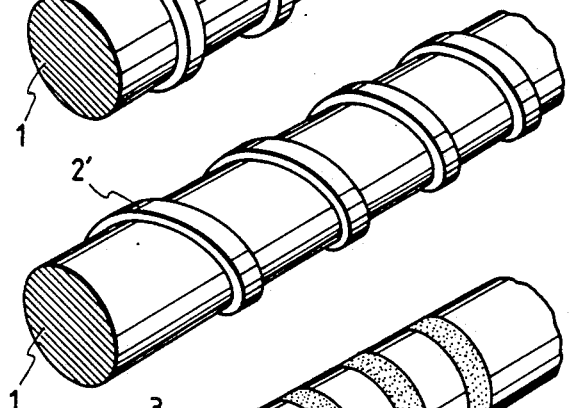
FIG. 1 (b)
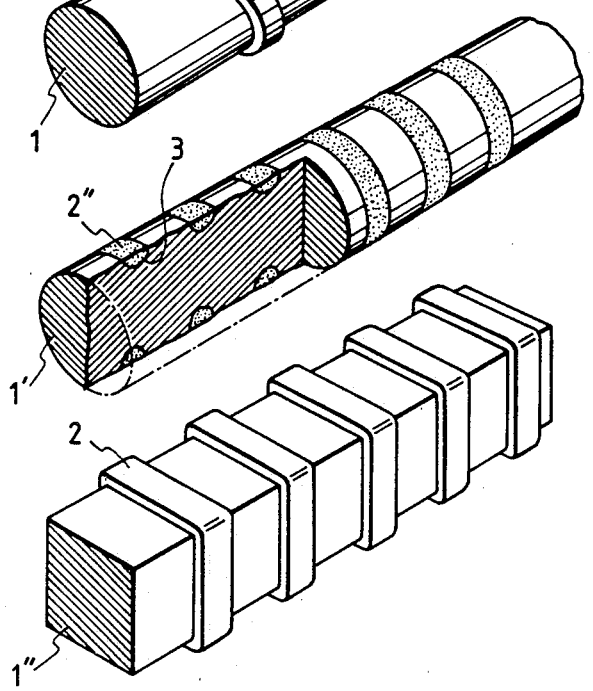
FIG. 1 (c)
FIG. 1 (d)

SUPERCONDUCTING COIL AND A METHOD FOR PRODUCING THE SAME

BACKGROUND OF THE INVENTION

1. Field of the invention

The present invention relates to a superconducting coil and a method for producing the same, more particularly it relates to a superconducting coil composed of a compound oxide type superconducting material.

The coil according to the present invention is applicable for manufacturing a small and light-weight actuator, motor or generator, electromagnetic valve, sensor or the like.

2. Description of the related art

A superconducting coil or solenoid which is realized by metal type superconductor such as a Ti-Nb alloy is already known and has been developed for a superconducting magnet or the like.

The critical temperature (Tc) of the metal type superconductors, however, could not exceed 23.2K of $Nb_3Ge$ which was the highest Tc for all studies for the past ten years and hence the use of liquidized helium (boiling point of 4.2K) as cryogen is indispensable for superconductivity. Therefore, their actual application is limited to special industrial or scientific fields and it is difficult to reduce their size or diameter to less than several 10 mm at present.

The possibility of the existence of a new type of superconducting material having a much higher Tc was revealed by Bednorz and Müller who discovered a new oxide type superconductor in 1986 [Z. Phys. B64 (1986) 189]. This new oxide type superconducting material discovered by Bednorz and Müller is [La, Ba]$_2$CuO$_4$ which is called the K$_2$NiF$_4$-type oxide having a crystal structure which is similar to the known perovskite type oxide. The K$_2$NiF$_4$-type oxides show such a high Tc as 30K which is extremely higher than the known superconducting materials. It was also reported in the news paper that C. W. Chu et al. discovered in the United States of America another type of superconducting material having the critical temperature of about 90K in Feb. 1987. This superconductor called as YBCO is a compound oxide of Ba-Y system represented by $YBa_2Cu_3O_7-\delta$.

From the discovery of the abovementioned new type of compound oxide type superconductors, the existence of high-temperature superconductors which exhibit superconductivity in inexpensive and readily available liquid nitrogen have arisen suddenly.

However, the abovementioned compound oxide is a ceramic material so that it is difficult or impossible to directly adopt the conventional techniques which are used in the metal type superconductors for producing a solenoid or coil.

Therefore, an object of the present invention is to provide a superconducting coil consisting of new type compound oxide which possesses a high critical temperature (Tc) and a method for producing the same.

SUMMARY OF THE INVENTION

The present invention provides a superconducting coil comprising a support and at least one ring-shaped and/or spiral turn of superconductor which is composed of superconducting compound oxide and is supported on a surface of said support.

The support on which the superconducting material is placed is preferably made of an insulator such as inorganic crystals, ceramics, porcelain, or glass such as strontium titanate (SrTiO$_3$), magnesium oxide (MgO), Al$_2$O$_3$, sapphire, SiO$_2$, quartz, ZnO or the like providing that they can withstand the sintering temperature in the next step and that they do not exert a bad influence in preparing a stable superconducting compound oxide. The material of the support is not limited to insulators but also may be electro-conducting metal, since electrical current preferentially passes through the superconductor under superconducting condition.

The support may be a hollow cylindrical body so that a core or an armature or the like can be inserted in the center of the hollow support.

The superconductor supported on the support can be a compound oxide represented by the formula:

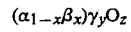

in which α stands for an element selected from IIa group of the Periodic Table, β stands for an element selected from IIIa group of the Periodic Table and an element γ stands for an element selected from a group comprising Ib, IIb, IIIb, IVb and VIII group of the Periodic Table, and x, y and z are numbers each having a range of $0.1 \leq x \leq 0.9$, $1.0 \leq y \leq 4.0$ and $1 \leq z \leq 5$ respectively.

The abovementioned oxides possess preferably perovskite type or quasi-perovskite type crystal structure. The term of quasi-perovskite type means a structure which can be considered to have a crystal structure that is similar to Perovskite-type oxides and includes an orthorhombically distorted perovskite or a distorted oxygen-deficient perovskite or the like.

It is known that the oxygen deficiency in the crystalline structure of the compound oxide is one of the critical factors for obtaining the high Tc (the critical temperature) superconductor of the perovskite type or quasi-perovskite type compound oxide. Therefore, the elements α, β, γ and oxygen (O) must be within the abovementioned proportions in order to obtain the proper crystalline structure and oxygen deficiency.

The element α of IIa group of the Periodic Table is preferably Ba or Sr. From 10 to 80% of Ba or Sr can be substituted by Mg and/or Ca. The element β of IIIa group of the Periodic Table is preferably at least one of elements selected from a group comprising Y, La, Gd, Ho, Er, Tm, Yb, Dy, Nd, Sm, Eu and Lu. The element γ is Cu (copper) in general. A portion of Cu may be substituted by another element selected from Ib, IIb, IIIb, IVb and VIII groups of the Periodic Table such as Ti, V or the like. Still more, a portion of the oxygen (O) may be substituted by another element such as fluorine.

The superconducting thin films according to the present invention may consists of Ba-Y-Cu system compound oxide, Ba-La-Cu system compound oxide and Sr-La-Cu system compound oxide such as YBa$_2$Cu$_3$O$_{6.7}$, Sr$_{0.15}$La$_{1.85}$CuO$_{3.5}$ or the like.

As preferred compound oxide, it can be mentioned the following compound oxide represented by the general formula:

in which, Ln stands for an element selected from a group comprising Y, La, Gd, Ho, Er, Tm, Yb and Lu, and δ is a number which satisfies $0 < \delta < 1$ and including the following systems:

$Y_1Ba_2Cu_3O_{7-x}$, $Ho_1Ba_2Cu_3O_{7-x}$, $Lu_1Ba_2Cu_3O_{7-x}$, $Sm_1Ba_2Cu_3O_{7-x}$, $Nd_1Ba_2Cu_3O_{7-x}$, $Gd_1Ba_2Cu_3O_{7-x}$, $Eu_1Ba_2Cu_3O_{7-x}$, $Er_1Ba_2Cu_3O_{7-x}$, $Dy_1Ba_2Cu_3O_{7-x}$, $Tm_1Ba_2Cu_3O_{7-x}$, $Yb_1Ba_2Cu_3O_{7-x}$, $La_1Ba_2Cu_3O_{7-x}$,
$(La, Sr)_2CuO_{4-x}$ in which x is a number which satisfies a range of $0 < x < 1$.

Of course, the superconductor of the present invention is applicable to the other type compound oxides having another system including the following compound oxide represented by the formula:

$$\Theta_4(\Phi_{1-q}Ca_q)_mCu_nO_{p+r}$$

in which $\Theta$ stands for Bi or Tl, $\Phi$ stands for Sr when $\Theta$ is Bi and stands for Ba when $\Theta$ is Tl, m and n are numbers each satisfying ranges of $6 \leq m \leq 10$ and $4 \leq n \leq 8$ respectively, $p = (6+m+n)$, q is a number which satisfies a range of $0 < q < 1$, and r is a number which satisfies a range of $-2 \leq r \leq +2$. This system is considered to be a single phase of the following compound oxide or a mixed phase consisting mainly thereof:

$Bi_4Sr_4Ca_4Cu_6O_{20-r}$, $Bi_2Sr_2Ca_2Cu_3O_{10-r}$,
$Tl_4Ba_4Ca_4Cu_6O_{20-r}$, $Tl_2Ba_2Ca_2Cu_3O_{10-r}$, in which r is a number which satisfies a range of $-2 \leq r \leq +2$.

According to another aspect of the present invention, it is also provided a method for producing a method for producing a superconducting coil, characterized by the steps comprising placing a superconducting material on a surface of a support, and then heating the superconducting material to a temperature at which the superconducting material is sintered to a superconductor.

The term of "placing" means any operation which can form a layer of the superconducting material on a surface of the support and which include coating, depositing, applying, wrapping or the like.

The superconductor placed on the support is preferably in a shape of at least one ring and/or of at least one spiral turn of a coil which can be prepared by any one of following processes:

(1) At least one ring-shaped or spiral groove is cut previously on an outer surface of the support so that the superconducting material is received in the groove.
(2) A paste composed of superconducting compound oxide and binder is applied directly on the surface of the support.
(3) The superconducting material is deposited on said support by physical vapour deposition (PVD) technique or chemical vapour deposition (CVD) technique.

In case of (2) and (3), the superconducting material may be applied or deposited on an entire surface of the support as a continuous layer and then a predetermined portion of the continuous layer of superconducting material is removed later to leave a portion of the continuous layer alone in a form of at least one ring-shaped or spiral turn on the support. It is also possible to provide such ring-shaped or spiral turn on the support by using a suitable masking member which is removable after the sintering stage and is arranged between adjacent turns.

It is also possible to apply or deposit the superconducting material on a part of the support in a shape of at least one ring or spiral turn of a coil directly.

In the first method (1), no binder is required to be added to the superconducting material, resulting in that the material is advantageously not contaminated, but the groove is indispensable to support the powder of superconducting compound oxide on a three dimensional support.

Still, it is necessary to leave a room for absorption or to compensate for shrinkage of the sintered mass which occurs during the sintering stage. Such shrinkage can be prevented by arranging a retractable or in the bottom of the groove. Such a retractable or shrinkable spacer may be made of a low melting point metal foam or an organic compound to reduce its volume or is burnt at the sintering stage, so that shrinkage of the sintered mass placed on the spacer in the groove is allowed with no breakage of the sintered mass.

The shrinkable spacer must be selected from such materials that do not exert a bad influence to the superconducting sintered mass but is preferably selected from materials which are decomposed and produce oxygen at the sintering temperature since the oxygen content in the superconducting compound oxide is a critical factor for realizing the superconductivity.

The superconducting material is preferably a sintered powder which is produced by the steps comprising mixing oxides, carbonates, nitrates or sulfonate of the abovementioned constituent elements $\alpha$, $\beta$ and $\gamma$ such as Ba or Sr, La or Y and Cu, subjecting the resulting mixture to a preliminary heat-treatment, the preliminary sintering operation, and then subjecting the resulting preliminary sintered mass to the final sintering. The sintering temperature is preferably selected in a range between the upper limit which is a melting point of said preliminary sintered mass and a lower limit which is not lower than 100° C. from the melting point. Namely, when the sintering temperature is not higher than the lower limit, the sintering reaction can not proceed satisfactorily and the sintered product obtained shows very low mechanical strength. In contrast, if the sintering temperature exceeds the upper limit, a liquid phase is produced during the sintering operation, so that the sintered mass is fused or decomposed resulting in lowering the Tc of the sintered body. The sintering temperature depends on the system of the compound oxide but is effected generally in a range of 600° to 1,200° C.

The superconducting material can be a powder which can be produced by pulverizing the abovementioned preliminarily sintered mass or the finally sintered block. The steps from sintering to pulverization are preferably repeated several times in order to produce a superior superconducting compound oxide having a fine crystalline structure and uniformity which result in the reduction of the discrepancy $\Delta T$ between set temperature (Tc) where the superconductivity is observed and the critical temperature (Tcf) where complete zero resistance is observed. The material powder is not limited to the sintered powder but may be a powder mixture of the abovementioned oxides, carbonates, nitrates or sulfonate of the constituent elements $\alpha$, $\beta$ and $\gamma$ which are not subjected to the sintering operation.

The proportion or atomic ratio of constituent elements $\alpha$, $\beta$ and $\gamma$ in the superconducting material is preferably adjusted to be equal to the proportion or atomic ratio of these elements in the finally sintered mass or superconductor which is represented by the abovementioned general formula: $(\alpha_{1-x}\beta_x)_\gamma\gamma_yO_z$, $Ln_1Ba_2Cu_3O_{7-\delta}$, $\Theta_4(\Phi_{1-q}Ca_q)_mCu_nO_{p+r}$ or the like.

The second method (2) in which paste of superconducting material mixed with binder is applied on the support and is sintered is basically same as the first method (1) except the binder is admixed with the superconducting material powder. In the second method, the ring shaped or spiral turn or turns can be formed relatively easily than the first method because such turn of coil can be shaped with the paste by the conventional insert-molding technique in which the paste is injected into a molding cavity defined between a pair of mold halves and the support placed in the mold halves. The turns of coil may be made simply by winding a strand or filament of paste around the support directly. In the second method also, it is necessary to absorb variation of dimension occurred by shrinkage of the sintered mass. In practice, in order to absorb such shrinkage, the abovementioned compensation technique can be adopted. Namely, a shrinkable spacer is placed in a groove of the support and the paste or a strand of paste is applied on the shrinkable spacer, so that the shrinkage at the sintering stage is absorbed by the spacer. In order to minimize such shrinkage, the increment of sintering temperature should be controlled precisely. The binder used in the paste can be selected from known binders which are used in the field of ceramic industry and can contain plasticizer, solvent or the like.

In case of the first and second method, an assembly of the support and the turn(s) supported on the support can be covered or wrapped by a case or a bladder so that the sintering is carried out in a HIP.

In the third method (3) in which a thin film of superconducting compound oxide is prepared by physical vapour deposition (PVD) or chemical vapour deposition (CVD) technique, the turn or turns of coil are shaped by the conventional lithography technique. Namely, a portion on the support where the thin film of compound oxide is not required to be deposited may be covered by a mask such as photoresist, pellicle or the like. The masking of the substrate can be omitted. In this case, a thin film of compound oxide is deposited on the whole surface of the support and then a part of the deposited thin film layer of compound oxide is removed in such manner that a ring-shaped or spiral continuous superconducting thin film of compound oxide is left about the support.

In case of PVD such as sputtering, vacuum deposition, ion plating or the like, a vapour source or target may be composed of a sintered mass of a compound oxide to be deposited on the support. Since a composition of vapour source, substrate temperature, sputtering pressure or the like are critical factors for preparing the superconducting thin film of compound oxide, they should be selected so that the superconductivity is realized in the deposited thin film.

The vapour source used in the physical vapour deposition is selected from any material that can produce the thin film of compound oxide on the support. For example, the vapour source or target may be prepared by a sintered product which is produced by the steps comprising mixing oxides, carbonates, nitrates or sulfonate of constituent elements such as Ba or Sr, La or Y and Cu, subjecting the resulting mixture to a preliminary heat-treatment so called preliminary sintering operation, and then subjecting the resulting preliminarily sintered mass to the final sintering at a temperature of 700° to 1,500° C.

The physical vapour deposition is preferably carried out in the presence of oxygen gas or reactive gas such as fluorine gas. In case of CVD process, a suitable carrier gas is used for carrying the constituent elements of the compound oxide or their compounds onto a substrate.

It is apparent from the description abovementioned that the method according to the present invention is advantageously applicable to mass production of small superconducting coils. For example, when a heat-resisting partition ring such as a metal washer is arranged between adjacent ring-shaped turns on a common support, a large number of coils are produced on the common support simultaneously.

The small coils produced according to the present invention can maintain a permanent current thereon, once a predetermined electric current is supplied to the ring-shaped superconducting thin film. Such permanent current can be supplied to the ring-shaped superconducting thin film by any one of known methods such as thermally controlled On-Off switching for permanent current, mechanical On-Off switching for permanent current or magnetically controlled switching.

The small superconducting solenoid produced according to the present invention is used in the field of small actuator, motor, electromagnetic valve, sensor, coil or similar devices which functions in relatively inexpensive cryogen such as liquidized nitrogen, hydrogen or neon.

Now, the method for producing a small superconducting coil according to the present invention will be described with reference to attached illustrative drawings, but the scope of the present invention should not be limited thereto.

BRIEF DESCRIPTION OF THE DRAWINGS

FIG. 1 (a) to (d) are perspective views illustrating several embodiments of small superconducting coils supported on a solid core or support according to the present invention, FIG. 2 (a) to (d) are similar to FIG. 1 but illustrate another embodiment of small superconducting coils supported on a hollow core or support according to the present invention.

FIG. 1 (a) illustrates a small superconducting coil according to the present invention. This coil comprises a solid cylindrical support 1 and a plurality of ring-shaped turns 2. FIG. 1 (b) illustrates another small superconducting coil according to the present invention. This coil comprises a solid cylindrical support 1 and a spiral turn 2'. FIG. 1 (c) illustrates a variation of the small superconducting coil of FIG. 1 (a) and comprises a solid cylindrical support 1 having a parallel grooves 3 and a plurality of ring-shaped turns 2" supported in the grooves 3. In FIG. 1 (d) which illustrates a still another variation of FIG. 1 (a), the solid support 1" has a rectangular cross section and the hollow turns have also rectangular cross section.

Figure 2A:
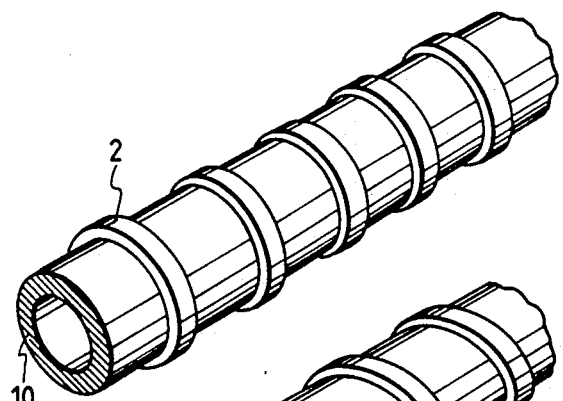
FIG. 2 (a) to (d) which correspond to FIG. 1 (a) to (d) have the same configuration as those of FIG. 1 (a) to (d) except that each of the supports 1 in FIG. 1 is replaced by a hollow support 10, 10' and 10" In a center hole or passage of the hollow support 10, 10' and 10", a core or armature (not shown) can be inserted or suitable cryogen for cooling the superconducting coil can be circulated.
Figure 2B:
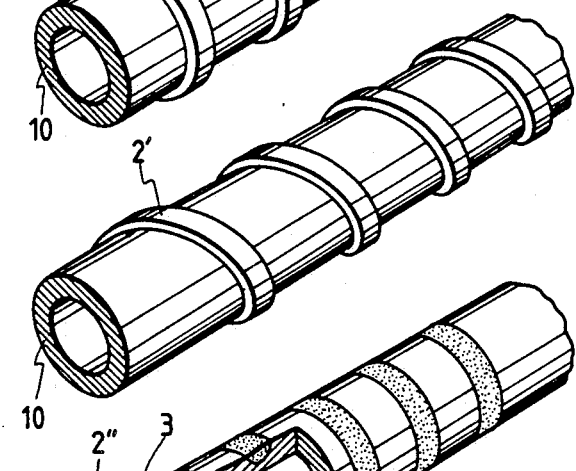
Figure 2C:
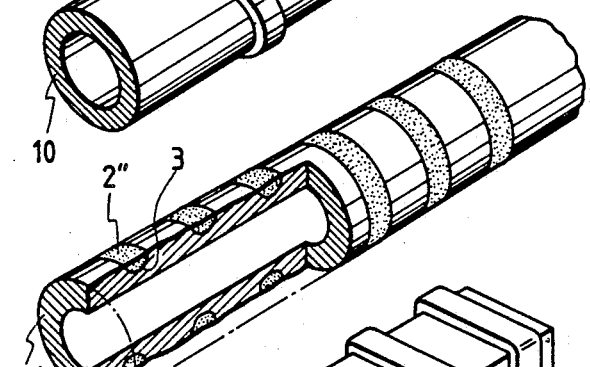
Figure 2D:
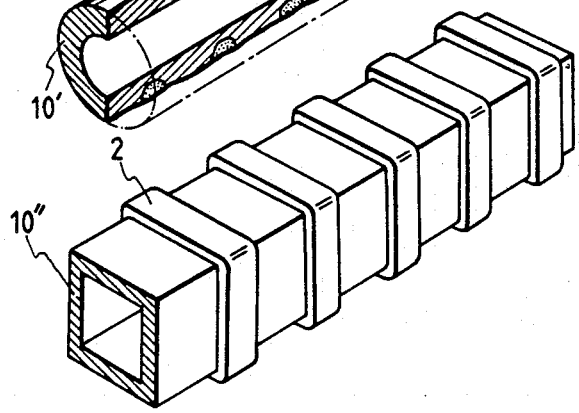

The small coil according to the present invention can maintain a permanent current thereon, once a predetermined electric current is supplied to the ring-shaped superconducting turn(s). Such permanent current can be supplied to the ring-shaped superconducting thin film by any one of known methods such as thermally controlled On-Off switching for permanent current, mechanical On-Off switching for permanent current or magnetically controlled switching.

What is claimed is:

1. A superconducting coil comprising a support and at least one ring-shaped or spiral turn of a superconductor, wherein said at least one ring-shaped or spiral turn is previously cut on an outer surface of said support so that a superconducting material is received on a groove, which is composed of a compound oxide represented by the formula:

$$(\alpha_{1-x}\beta_x)\gamma_y O_z$$

in which $\alpha$ stands for an element selected from group IIa of the Periodic Table, $\beta$ stands for an element selected from group IIIa of the Periodic Table and an element $\gamma$ stands for an element selected from the group comprising group Ib, IIb, IIIb, IVb and VIII of the Periodic Table, and x, y, and z are numbers each having a range of $0.1 \leq x \leq 0.9$, $1.0 \leq y \leq 4.0$ and $1 \leq z \leq 5$, respectively and is supported on a surface of said support.

2. A superconducting coil set forth in claim 1, wherein said support is made of an insulator.

3. A superconducting coil set forth in claim 1, wherein said support is a hollow cylindrical body.

4. A superconducting coil set forth in claim 1, wherein said support is made of a material selected from the group comprising silicon, MgO, SrTiO$_3$, Al$_2$O$_3$, sapphire, SiO$_2$, quartz, YSZ and ZnO.

5. A superconducting coil set forth in claim 1, wherein said superconducting material is a compound oxide represented by the general formula:

$$Ln_1Ba_2Cu_3O_{7-\delta}$$

in which, Ln stands for an element selected from the group comprising Y, La, Gd, Ho, Er, Tm, Yb, Nd, Sm, Eu and Lu, $\delta$ is a number which satisfies a range of $0 < \delta < 1$.

6. A superconducting coil comprising a support and at least one-ring-shaped or spiral turn of a superconductor, wherein said at least one ring-shaped or spiral turn is previously cut on an outer surface of said support so that a superconducting material is received on a groove, which is composed of a compound oxide represented by the general formula:

$$\Theta_4(\Phi_{1-q}Ca_q)_m Cu_n O_{p+r}$$

in which $\Theta$ stands for Bi or Tl, $\Phi$ stands for Sr when $\Theta$ is Bi and stands for Ba when $\Theta$ is Tl, m and n are numbers each satisfying ranges of $6 \leq m \leq 10$ and $4 \leq n \leq 8$ respectively, $p = (6+m+n)$, q is a number which satisfies a range of $0 < q < 1$, and r is a number which satisfies a range of $-2 \leq r \leq +2$.

7. A superconducting coil set forth in claim 6, wherein said superconductor is a compound oxide represented by the formula:

$$(\alpha_{1-x}\beta_x)\gamma_y O_z$$

in which $\alpha$ stands for an element selected from group IIa of the Periodic Table, $\beta$ stands for an element selected from group IIIa of the Periodic Table and an element $\gamma$ stands for an element selected from the group comprising group Ib, IIb, IIIb, IVb and VIII of the Periodic Table, and x, y and z are numbers each having a range of $0.1 \leq x \leq 0.9$, $1.0 \leq y \leq 4.0$ and $1 \leq z \leq 5$ respectively.

8. A superconducting coil set forth in claim 7, wherein said superconductor is a compound oxide represented by the general formula:

$$Ln_1Ba_2Cu_3O_{7-\delta}$$

in which, Ln stands for an element selected from the group comprising Y, La, Gd, Ho, Er, Tm, Yb, Nd, Sm, Eu and Lu, $\delta$ is a number which satisfies a range of $0 < \delta < 1$.

9. A method for producing a superconducting coil, comprising the steps of placing a superconducting material on a surface of a support, and then heating the superconducting material to a temperature at which the superconducting material is sintered to a superconductor.

10. A method set forth in claim 9, wherein said superconducting material is placed in a shape of at least one ring-shaped or spiral turn of a coil.

11. A method set forth in claim 9, wherein a whole surface of said support is first covered with said superconducting material to form a continuous layer of said superconducting material on said support, and then a predetermined portion of said continuous layer of said superconducting material is removed to leave at least one ring-shaped or spiral turn on said support.

12. A method set forth in claim 9, wherein said support is made of an insulator.

13. A method set forth in claim 9, wherein said support is a hollow cylindrical body.

14. A method set forth in claim 9, wherein said support is made of a material selected from the group comprising silicon, MgO, SrTiO$_3$, Al$_2$O$_3$, sapphire, SiO$_2$, quartz, YSZ and ZnO.

15. A method set forth in claim 9, wherein said support has a ring-shaped or spiral groove on its outer surface so that said superconducting material is received in said groove.

16. A method set forth in claim 9, wherein said superconducting material is a paste composed of a superconducting compound oxide and a binder.

17. A method set forth in claim 9, wherein said superconducting material is deposited on said support by a physical vapour deposition technique or a chemical vapour deposition technique.

18. A superconducting coil set forth in claim 9, wherein said superconducting material is a compound oxide represented by the general formula:

$$\Theta_4(\Phi_{1-q}Ca_q)_m Cu_n O_{p+r}$$

in which $\Theta$ stands for Bi or Tl, $\Phi$ stands for Sr when $\Theta$ is Bi and stands for Ba when $\Theta$ is Tl, m and n are numbers each satisfying ranges of $6 \leq m \leq 10$ and $4 \leq n \leq 8$ respectively, $p = (6+m+n)$, q is a number which satisfies a range of $0 < q < 1$, and r is a number which satisfies a range of $-2 \leq r \leq +2$.

* * * * *